United States Patent
Mori (10) Patent No.: US 6,369,447 B2
(45) Date of Patent: *Apr. 9, 2002

(54) PLASTIC-PACKAGED SEMICONDUCTOR DEVICE INCLUDING A PLURALITY OF CHIPS

(75) Inventor: Ryuichiro Mori, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/172,086

(22) Filed: Oct. 14, 1998

(30) Foreign Application Priority Data

Apr. 20, 1998 (JP) ............................................. 10-109192

(51) Int. Cl.$^7$ ................................................. H01L 23/52
(52) U.S. Cl. ....................... 257/777; 257/673; 257/690; 257/779; 257/780; 257/737; 257/723; 257/724; 257/685; 257/686; 361/813
(58) Field of Search ............................... 257/777, 779, 257/780, 737, 723, 724, 676, 685, 673, 686, 690; 361/813

(56) References Cited

U.S. PATENT DOCUMENTS

| | | | |
|---|---|---|---|
| 5,508,565 A | * | 4/1996 | Hatakeyama et al. ........ 257/777 |
| 5,677,567 A | * | 10/1997 | Ma et al. ..................... 257/666 |
| 5,744,863 A | * | 4/1998 | Culnane et al. .............. 257/712 |
| 5,789,815 A | * | 8/1998 | Tessier et al. ............... 257/723 |

FOREIGN PATENT DOCUMENTS

| | | |
|---|---|---|
| JP | 03198367 A | 8/1981 |
| JP | 4-61152 | 2/1992 |
| JP | 5-67726 | 3/1993 |
| JP | 5-109975 | 4/1993 |
| JP | 7-130949 | 5/1995 |
| JP | 408298299 A | * 11/1996 |

OTHER PUBLICATIONS

Korean Office Action dated Jun. 28, 2001.

* cited by examiner

Primary Examiner—Minh Loan Tran
Assistant Examiner—Luan Thai
(74) Attorney, Agent, or Firm—McDermott, Will & Emery (57) ABSTRACT

There are described an improvement in the mass-productivity of a plastic-packaged semiconductor device which includes a plurality of chips that are connected to leads and assembled into one package while their main surfaces are positioned so as to oppose one another and which enables selection of one of the chips with a fewer number of leads. The semiconductor device includes a pair of identical chips including a plurality of electrode pads provided in a row in the center of the main surface of the chip, and the electrode pads provided in the corresponding positions form a pair of electrode pads. The plurality of electrode pads which permit input or output of a common signal in or from the chips are connected to the respective sides of the common lead by way of a pair of electrode bumps. Two pairs of electrode pads which permit input or output of individual signals to the respective chips and which are provided side by side to each other are electrically connected to respective sides of the common lead by way of an electrode bump formed on one of the pair of electrode pads as well as by way of another adjacent electrode bump formed on the electrode pad of the other pair of electrode pads.

6 Claims, 10 Drawing Sheets

PLASTIC-PACKAGED SEMICONDUCTOR DEVICE INCLUDING A PLURALITY OF CHIPS

BACKGROUND OF THE INVENTION

1. Field of the Invention

The present invention relates to a semiconductor device, and more particularly to a plastic-packaged semiconductor device in which the main surfaces of a plurality of chips are connected to leads while being arranged so as to oppose one another.

2. Background Art

A plastic-packaged semiconductor device having two chips encapsulated therein is disclosed in, e.g., (1) Japanese Patent Application Laid-open No. Hei-7-130949, (2) Japanese Patent Application Laid-open No. Hei-4-61152, and (3) Japanese Patent Application Laid-open No. Hei-5-109975.

Publication (1) describes a semiconductor device having two chips encapsulated therein such that their main surfaces are arranged so as to oppose each other with a lead sandwiched therebetween and such that each of the main surfaces faces the corresponding side of the lead. Electrode pads are provided on the respective surfaces of the chips in a symmetrical pattern. The electrode pads facing each other are connected to a common lead with electrode bumps disposed between the respective pads and the lead. As can be seen from FIG. 2 of Publication (1), in order to enable selection of one of the chips, the two chips additionally required a total of six electrode pads, six electrode bumps, and two lead frames. Further, there must be separately prepared chips having electrode pads arranged thereon in different patterns, thus deteriorating the mass-productivity of the semiconductor device.

Publication (2) describes a semiconductor device having two chips encapsulated therein such that their main surfaces are arranged so as to oppose each other with a lead sandwiched therebetween and such that each of the main surface faces the corresponding side of the lead. Electrode pads are provided on the respective main surfaces of the chips in a symmetrical pattern while a common lead is sandwiched therebetween. A signal other than a chip selection signal is input to a pair of electrode pads as a common signal. Another pair of electrode pads are provided on the respective main surfaces in an asymmetrical pattern, and one of the electrode pads is connected to a lead specifically provided for one chip, and the other electrode pad is connected to a lead specifically provided for the other chip. Only the chip selection signal is input to the electrode pad of the chip to be selected. As can be seen from FIG. 2 of Publication (2), to enable selection of one of the chips, a dummy pad not connected to an internal circuit of the chip must be additionally provided on each chip, and there must be separately prepared chips having electrode pads arranged in different patterns.

Publication (3) describes a semiconductor device comprising two chips. Electrode pads are provided in the center of the main surface of each chip and are arranged along the longitudinal direction. The chips are encapsulated in a package in such a way that the main surfaces of the chips are oriented in the same direction. The corresponding electrode pads provided on the chips are connected to a common lead by means of a wire, thus rendering a manufacturing process complicated. As shown in FIGS. 6 and 8 of Publication (3), two lead frames are required, adding to the manufacturing cost.

The present invention has been conceived to solve such drawbacks as mentioned previously, and a first object of the present invention is to provide a plastic-packaged semiconductor device which has improved mass-productivity and enables selection of one of a plurality of chips with a fewer number of leads, wherein the main surfaces of the chips are connected to leads and are arranged so as to face one another.

A second object of the present invention is to provide a plastic-packaged semiconductor device which comprises two chips having electrode pads provided thereon in an identical pattern and having their main surfaces arranged so as to oppose each other and which enables selection of one of the two chips through use of one lead frame.

A third object of the present invention is to provide a plastic-packaged semiconductor device which comprises two chips having electrode pads provided thereon in a symmetrical pattern and having their main surfaces arranged so as to oppose each other and which enables selection of one of the chips through use of one lead frame.

SUMMARY OF THE INVENTION

According to one aspect of the present invention, a plastic-packaged semiconductor device comprises at least a pair of chips, and the pair of chips are positioned so as to face each other and connected to common leads between the pair of chips.

The pair of chips include a plurality of electrode pads which are provided respectively in mutually corresponding positions on the main surface of the respective chips such that the electrode pads provided in the corresponding positions form a plurality of pairs of electrode pads between the pair of chips.

A plurality of pairs of electrode pads are electrically connected respectively to opposite sides of one of the common leads by way of electrode bumps formed on each of the respective electrode pads, and permit input or output of a common signal in or from the chips.

Further, a pair of electrode pads are provided side by side to each other between the pair of chips. One of the pads is electrically connected to one side of a selected common lead by way of an electrode bump formed on the electrode pad, and the other of the pads is electrically connected to other side of the selected common lead by way of an electrode bump formed on the electrode pad. The pair of electrode pads permit input or output of individual signals to the respective chips.

According to another aspect of the invention, a pair of electrode pads are provided mutually at selected positions between the pair of chips. One of the pads is electrically connected to a first selected lead by way of an electrode bump formed on the electrode pad, and the other of the pads is electrically connected to a second selected lead by way of an electrode bump formed on the electrode pad. The pair of electrode pads permit input or output of individual signals to the respective chips.

In another aspect, in the semiconductor device, the pair of pads are arranged in a row substantially along the center line of the main surface of the respective chips.

In another aspect, in the semiconductor device, the pair of pads are arranged in two rows on the main surface of the respective chips in a longitudinal direction.

In another aspect, in the semiconductor device, a plurality of electrode pads are provided on the main surface of the respective chips in a symmetrical manner such that the electrode pads provided in corresponding positions form a pair of electrode pads.

In another aspect, in the semiconductor device, each of the pair of chips works as a composite chip which incorporates therein a plurality of unit chips.

In another aspect, in the semiconductor device, the electrode pads are formed into a row substantially along the center line of the main surface of the chips and are electrically connected to the leads, and the lead are fixedly bonded to the main surfaces of the chips by means of a resin-made adhesive.

Other and further objects, features and advantages of the invention will appear more fully from the following description. dr

DETAILED DESCRIPTION OF THE PREFERRED EMBODIMENTS

Some embodiments of the present invention will be described hereinbelow by reference to the accompanying drawings. Throughout the specification, like reference numerals designate like or identical elements.
First Embodiment FIGS. 1A through 1D are cross-sectional views arranged in sequential order of manufacture of a semiconductor device according to a first embodiment of the present invention.

Figure 2A:
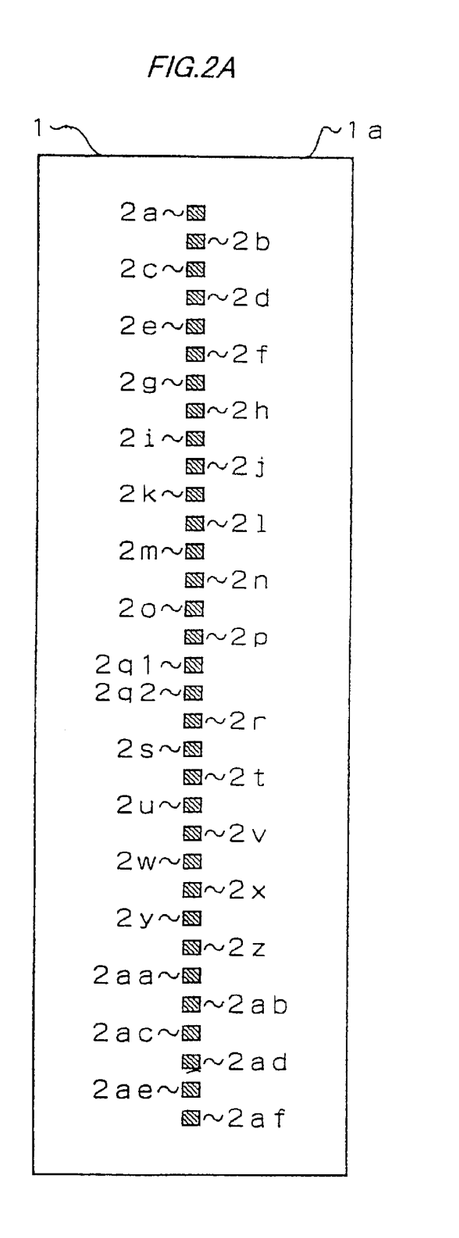
FIGS. 2A and 2B are plan views for describing the layout of electrode pads according to the first and second embodiments.
Figure 2B:
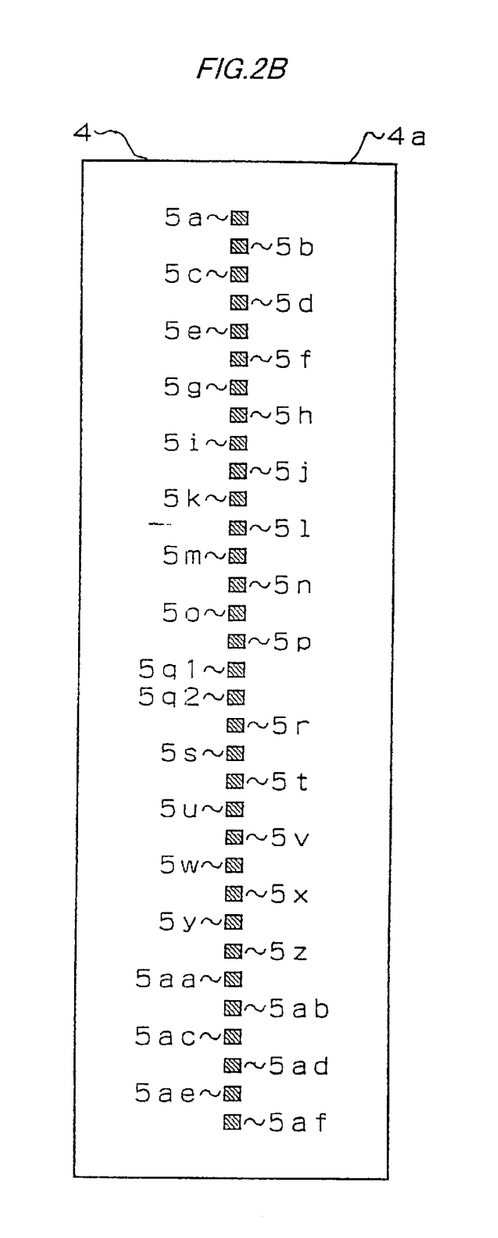
Figure 3:
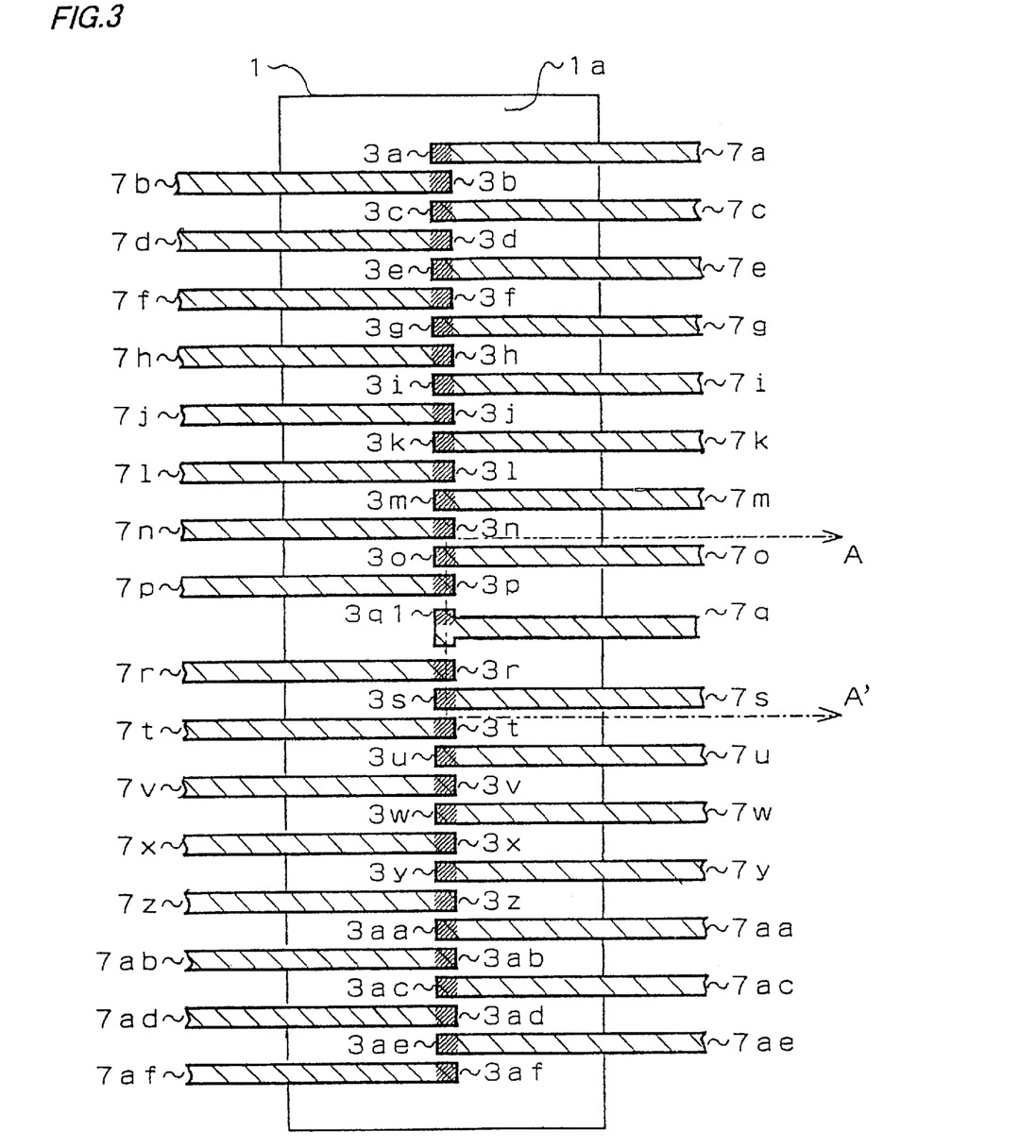
FIG. 3 is a plan view for describing connection between leads and electrode bumps according to the first embodiment.
Figure 4A:
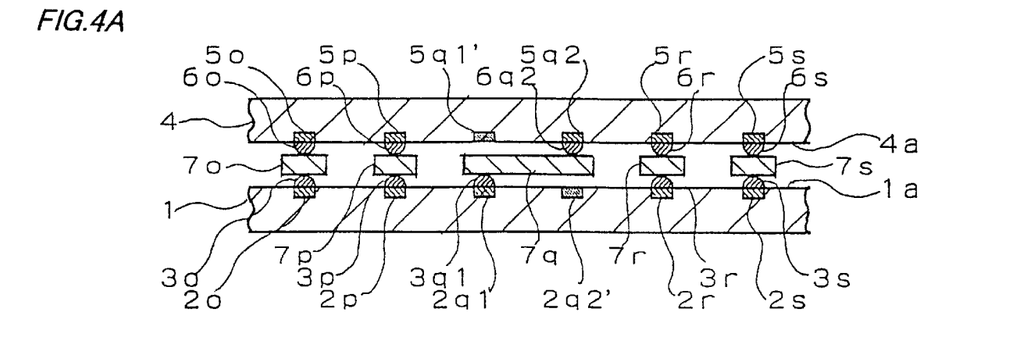
FIGS. 4A and 4B are cross-sectional views for explaining connection among electrode pads, electrode bumps, individual leads, and common leads according to the first, second, and fourth embodiments.

FIGS. 2A and 2B are plan views for describing the layout of electrode pads according to the first embodiment; FIG. 3 is a schematic representation showing connection between leads and electrode bumps; and FIG. 4A is a cross-sectional view for explaining connection among electrode pads, electrode bumps, and common leads.

First described is the configuration of a semiconductor device having chips, such as semiconductor memory chips, encapsulated therein. A first chip 1 and a second chip 4 are positioned so as to oppose each other while the main surface 1a of the chip 1 is oriented upward and the main surface 4a of the chip 4 is oriented downward. An electrode pad 2 is provided on the main surface 1a of the chip 1, and an electrode bump 3 is provided on the electrode pad 2. Similarly, an electrode pad 5 is provided on the main surface 4a of the chip 4, and an electrode bump 6 is provided on the electrode pad 5. The electrode pads 2 and 5 are connected to a lead 7 common to the chips 1 and 4 by way of the respective electrode bumps 3 and 6. Further, the chip 1 is fixed to the lead 7 by means of an adhesive material 8a, and the chip 4 is fixed to the lead 7 by means of an adhesive material 8b. The chips are assembled into one package. The lead 7 is formed from one lead frame.

FIG. 2A shows the layout of the electrode pad 2 of the chip 1, and FIG. 2B shows the layout of the electrode pad 5 of the chip 4. The electrode pads 2 are respectively composed of openings of, e.g., aluminum lead patterns which are connected to an un-illustrated internal circuit of the chip and which are formed so as to become exposed on the main surface of the chip. In the case of a semiconductor memory chip, electrode pads are used for receiving or outputting a signal and are each assigned power, a ground, a control signal, an address signal, a data signal, and CE and /CE signals used for selecting the chip 1.

As in the case of the electrode pads 2 and 5, an electrode pad without a subscript is used to collectively designate electrode pads having subscripts suffixed thereto.

The electrode pads 2 of the chip 1 comprises thirty-three pads, e.g., $2a$ to $2p$, $2q1$, $2q2$, $2r$ to $2z$ and $2aa$ to $2af$, arranged in a row substantially along the center line of the main surface 1a. The electrode pads $2a$ to $2p$, $2r$ to $2z$, and $2aa$ to $2af$ permit input or output of signals other than the chip selection signals. The electrode $2q1$ permits the selection signal CE to enter the chip 1. When the signal CE has a high logic level, the chip 1 is selected. The electrode $2q2$ permits the selection signal /CE to enter the chip 1. When the signal /CE has a low logic level, the chip 1 is selected. The electrode pad $2q1$ for receiving the CE signal and the electrode pad $2q2$ for receiving the /CE signal are provided side by side to each other. When having a high voltage of more than 4.7V or more, the selection signal CE is the to have a high logic level. In contrast, when having a low voltage of, e.g., 0.3V or less, the selection signal /CE is the to have a low logic level.

As shown in FIG. 2B, the electrode pads 5 of the second chip 4 comprises thirty-three pads, e.g., $5a$ to $5p$, $5q1$, $5q2$, $5r$ to $5z$, and $5aa$ to $5af$, arranged in a row in substantially along the center line of the main surface 4a. The electrode pads $5a$ to $5p$, $5r$ to $5z$, and $5aa$ to $5af$ permit input or output of signals other than the chip selection signals. The electrode $5q1$ permits the selection signal CE to enter the chip 4. When the signal CE has a high logic level, the chip 4 is selected. The electrode $5q2$ permits the selection signal /CE to enter the chip 4. When the signal /CE has a low logic level, the chip 4 is selected. The electrode pad $5q1$ for receiving the CE signal and the electrode pad $5q2$ for receiving the /CE signal are provided side by side to each other.

As can be seen from the comparison of FIGS. 2A and 2B, the electrode pads 2 of the chip 1 and the electrode pads 5 of the chip 4 are provided on the individual main surfaces so as to become mirror images of each other or for electrode pairs such as $2a$ and $5a$, $2b$ and $5b$, ..., $2af$ and $5af$.

Similarly, the electrode pad $2q1$ of the chip 1 and the electrode pad $5q1$ of the chip 4 are provided in corresponding positions on the individual main surfaces so as to match each other. Further, the electrode pad 2q2 of the chip 1 and the electrode pad 5q2 of the chip 4 are provided in corresponding positions on the individual main surfaces so as to match each other.

As mentioned previously, the electrode pads 2 and 5 of the pair of chips 1 and 4 are provided in corresponding positions on the individual main surfaces. As a result, a plurality of completely-identical electrode pads are provided in a row substantially along the center line of the main surfaces of the chips, thus enabling input or output of a completely identical signal into or from a pair of electrode pads positioned on the corresponding positions. So long as a layout condition of electrode pads is satisfied, a pair of chips, for example, may be manufactured into a pair of identical products in an identical lot or manufactured respectively according to different product specifications.

Figure 1A:
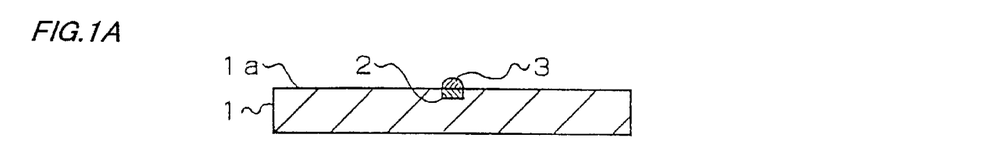
FIGS. 1A to 1D are cross-sectional views arranged in sequential order of manufacture of a semiconductor device according to first and second embodiments of the present invention.
Figure 1B:
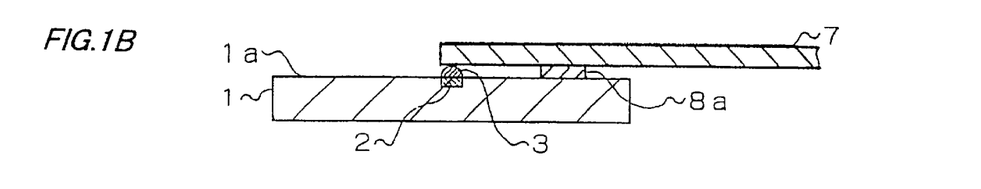

Next, as shown in FIG. 1B, an electrode bump 3 is formed on the surface of the electrode pad 2 of the first chip 1 except for the surface of the electrode pad 2q2. The electrode pad 2 is bonded to the edge of the lead 7 by way of the electrode bump 3 by means of a thermo-compression bonding method. The electrode bump 3 is formed from high-temperature solder having, e.g., composition 95Pb-5Sn. After the electrode bump 3 has been subjected to thermo-compression bonding, the first chip 1 and the lead 7 are fixedly bonded together by means of the adhesive material 8a, thus preventing contact failures, which would otherwise be caused by movement of the chip 1 or inclination of the lead 7 during a post-processing step for encapsulating the chips with resin.

FIG. 3 is a plan view showing connection between the leads 7 and the electrode bumps 3 provided on the main surface 1a of the chip 1 shown in FIG. 1A. For simplicity, the foregoing electrode pads 2 (i.e., the electrode pads 2a to 2z, 2aa to 2af, 2q1, and 2q2) are left out of the drawing. In FIG. 3, the electrode bump 3 provided on the electrode pad 2 is electrically connected to the lead 7: that is, an electrode bump 3a provided on an electrode pad 2a is connected to a lead 7a; an electrode bump 3b provided on an electrode pad 2b is connected to a lead 7b, . . . , and an electrode bump 3af provided on an electrode pad 2af is connected to a lead 7af.

As shown in FIG. 3, with regard to the electrode pad 2q1 for receiving the signal CE and the electrode pad 2q2 for receiving the signal /CE provided on the chip 1, an electrode bump 3q1 is formed on the electrode pad 2q1 and is connected to the T-shaped edge of a lead 7q. An electrode bump 3q2 is not formed on the other electrode pad 2q2, and the electrode pad 2q2 is not connected to the lead 7q. For this reason, the electrode bump 3q2 does not exist and therefore is not shown in FIG. 3.

Figure 4B:
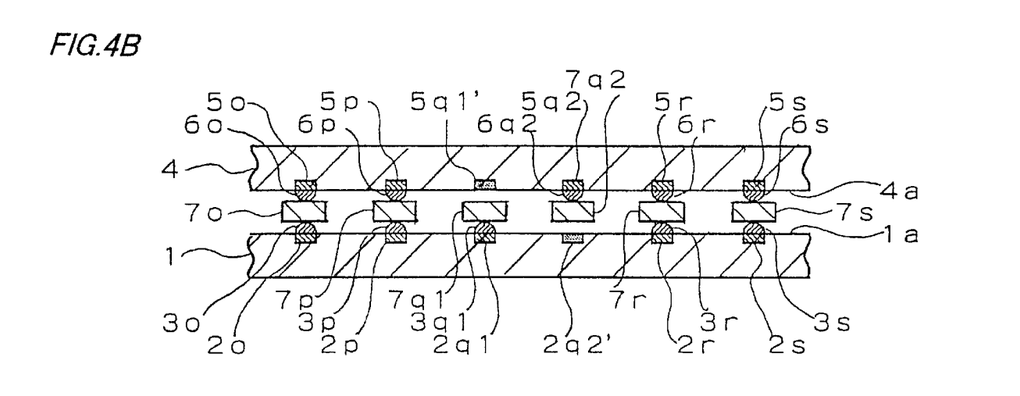

In FIGS. 4A and 4B, the electrode pad 2q2 having no electrode bump formed thereon will be hereinafter designated together with an apostrophe, in the manner of 2q2'. Further, although the edge of the lead 7q assumes a T-shaped pattern in the drawing, the edge may be formed into another appropriate shape such as an L-shaped pattern, so long as a sufficient area can be ensured between the electrode pad 2q1 of the chip 1 and the electrode pad 5q2 of the chip 4.

Figure 1C:
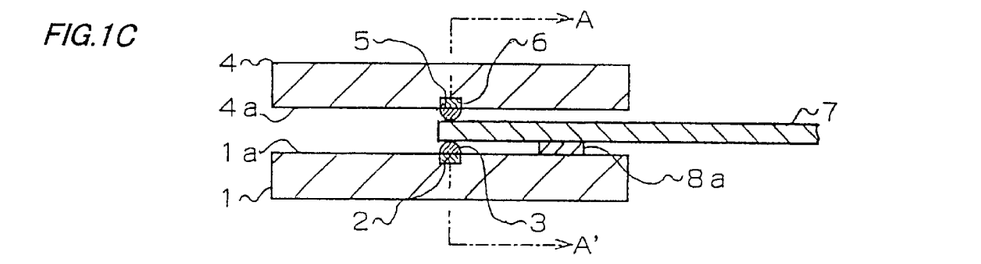

Next, as shown FIG. 1C, the electrode bump 6 is formed on the surface of the electrode pad 5 provided on the second chip 4 except for the surface of the electrode pad 5q1. The electrode pad 5 is bonded to the reverse side of the lead 7, which has the front side bonded to the electrode bump 3 of the first chip 1, by means of thermo-compression bonding. The electrode bump 6 is formed from solder having a fusing point lower than that of the electrode bump 3; for example, Pb-Sn eutectic solder, thus preventing failures such as re-melting of the electrode bump 3 already bonded in the step shown in FIG. 1B.

The ends of the corresponding leads 7a to 7z and 7aa to 7af, which are provided in FIG. 3 and are bonded to the electrode bump 3 of the first chip 1, are bonded at their reverse sides to electrode bumps 6a to 6z and 6aa to 6af of the second chip 4, respectively. The electrode bump 6q2 of the electrode pad 5q2 of the chip 4 is bonded to the reverse side of the lead 7q, which is shown in FIG. 3 and has its front side bonded to the electrode bump 3q1 of the chip 1, in such a way that the bump 3q1 is connected to one end of the T-shaped edge and that the bump 6q2 is connected the other end of the same. Accordingly, each lead 7 according to the first embodiment, i.e., each lead 7a to 7z, and 7aa to 7af, serves as a lead shared between the chips 1 and 4.

The electrode bump 6q1 is not formed on the electrode pad 5q1 of the chip 4, and the electrode pad 5q1 is not connected to the end of the T-shaped edge of the lead 7q. Accordingly, as in the case of the pad 2q2 of the chip 1, the electrode pad 5q1 is designated together with an apostrophe in the drawings subsequent to FIG. 4.

FIG. 4A is a cross-sectional view for describing connection among a plurality of pairs of electrode pads provided substantially along the center line of the main surfaces 1a and 4a of the chips 1 and 4 according to the first embodiment, and more particularly a cross-sectional view for describing connection between the pair of electrode pads for receiving the CE signal, connection between the pair of electrode pads for receiving the /CE signal, connection between the electrode bump 3, 6 and the lead 7. The cross-sectional view is taken along the chain line A—A passing through the center of the electrode pad provided in the cross-sectional view of FIG. 1C, as well as along the chain line A—A passing through the center of the electrode bump provided in the plan view of FIG. 3.

In FIG. 4A, when an identical signal common to the chips 1 and 4 is input to or output from both sides of respective identical lead 7o, 7p, 7r or 7s shared between the chips 1 and 4, a plurality of electrode pads provided on the corresponding positions on the main surfaces 1a and 4a; that is, (2o, 5o), (2p, 5p), (2r, 5r), and (2s, 5s), are electrically connected together.

Of the four electrode bumps, i.e., the electrode pads 2q1 and 5q1 for receiving the CE signal and the electrode pads 2q2 and 5q2, the two electrode pads 2q2 and 5q1 do not exist. Accordingly, the electrode pad 2q1 of the chip 1 and the electrode pad 5q2 of the chip 4 are electrically connected to the lead 7q which permits input or output of a chip selection signal.

A signal input to or output from the chip 1 by way of the electrode pad 2q1 provided on one side of the lead 7q is different from a signal input to or output from the chip 4 by way of the electrode pad 5q2 provided on the other side of the same. In such a case, not a pair of electrode pads placed in corresponding positions but a pair of electrode pads provided side by side to each other are electrically connected together.

After the electrode pads 2 and 5 of the pair of chips 1 and 4 have been electrically connected together by way of the respective electrode bumps 3 and 6, the second chip 4 is fixedly bonded to the lead 7 by means of the adhesive material 8b in the step shown in FIG. 1C. In the step shown in FIG. 1D, the chips are encapsulated in a resin 9 and molded, whereby a plastic-packaged semiconductor device is manufactured.

Now, some modifications of the first embodiment will now be described.

(A) Although the chip selection signals CE and /CE have been described as an example in which individual different signals are input to or output from the chips, the present invention is not limited to such an embodiment. Various types of operation mode selection signals may be employed. For example, there may be employed a signal for selecting a step-down mode in which an external supply voltage is supplied while being dropped relative to an internal reference voltage or a signal for selecting a test mode in which a high voltage is supplied.

(B) Although the description has explained the embodiment—in which the logic high level is 4.7V or more and the logic low level is 0.3V or less—as an example of input or output of individual different signals into or output from the chips, the present invention is not limited to this embodiment. Switching between a voltage higher than a certain reference voltage and a voltage lower than the same can be applied to switching between a positive reference voltage and a negative reference voltage.

(C) A pair of electrode pads provided side by side to each other are not limited to the longitudinal center of the electrode pads arranged in a row, as in the case of the pair of electrode pads $2q1$ and $5q2$. For example, the electrode pads provided side by side to each other may be placed at the longitudinal end of the line of the electrode pads, as in the case of the electrode pads $2a$, $5a$. Further, two or more of a pair of electrode pads positioned side by side to each other may be provided at the end and in the center of the line of electrode pads.

(D) Although the description has explained the case where the electrode pads provided side by side to each other are electrode pads for receiving the CE and /CE signals, the number of electrode pads positioned side by side to each other is not limited to one kind. Two pairs or electrode pads or more, e.g., a pair of electrode pads for receiving the CE and /CE signals and a pair of electrode pads for receiving mode selection signals, may be provided side by side to one another.

(E) Although the description has explained the case where the electrode pad and the electrode bump are formed from different materials through different heating steps, they may be formed from an identical material through an identical process.

Figure 5:
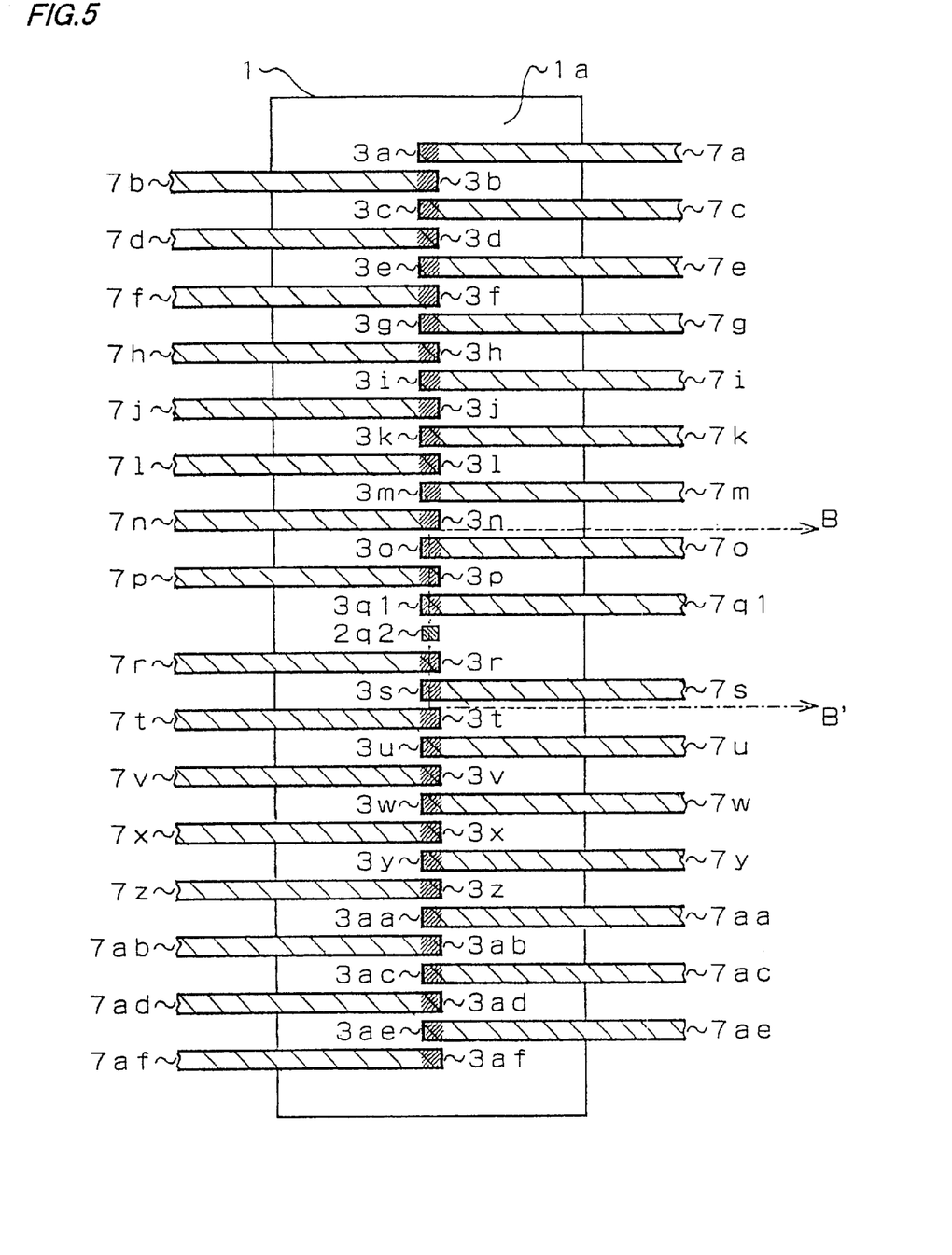
FIG. 5 is a plan view for describing connection between leads and electrode bumps according to the second embodiment.

As has been described above, the semiconductor device according to the first embodiment is characterized by comprising (a) a pair of identical chips having their main surfaces and a plurality of electrode pads arranged in a row in the center of the main surfaces, and pairs of electrode pad are formed by the electrodes provided in corresponding positions; (b) a plurality of electrode pads for receiving or outputting a common signal which are connected to both sides of the common lead by way of electrode pads; and (c) two pairs of adjacent electrode pads which permit input or output of different individual signals and which are electrically connected to both sides of the common lead, by way of an electrode bump of one pair of electrode pads and an electrode bump of the other pair of electrode pads Second Embodiment FIG. 5 is a plan view for describing connection between electrode bumps and leads according to a second embodiment of the present invention. FIG. 4B is a cross-sectional view for describing connection among electrode pads, electrode bumps, and individual leads. There will be omitted description of the reference numerals in the drawings which are identical with or correspond to those shown in FIGS. 3 and 4A described for the first embodiment. The cross-sectional views arranged in sequential order of manufacture of a semiconductor device, i.e., FIGS. 1A to 1D, and the layout of electrode pads, i.e., FIGS. 2A and 2B, are used for describing only relevant portions.

For a chip 1, FIG. 5 shows connection among the electrode pads 2, the electrode bumps 3, and the leads 7. The second embodiment shown in FIG. 5 is different from the first embodiment shown in FIG. 3 in that the electrode pad $3q1$ is formed on the electrode pad $2q1$ and is connected to the I-shaped edge of the lead $7q1$, and that the lead $7q1$ serves as a separate individual lead.

With regard to the electrode pad 2, only the electrode pad $2q2$ on which the electrode bump $3q2$ is not formed is illustrated. For simplicity, the electrode pad $2q1$ on which an electrode bump is formed and other electrode pads $2a$ to $2p$, $2r$ to $2z$, and $2aa$ to $2af$ are left out of the drawing.

For a chip 4, the connection among the electrode pad 5, the electrode bump 6, and the lead 7 is left out of the drawing. The electrode pad $5q2$ of the chip 4—which matches in position the electrode pad $2q2$ of the chip 1 (see FIG. 5)—is bonded to the I-shaped edge of another lead $7q2$ provided so as to oppose the lead $7q1$ shown in FIG. 5, by way of the electrode bump $6q2$ formed on the electrode pad $5q2$.

In short, the second embodiment is different from the first embodiment shown in FIG. 3 merely in that the lead $7q1$ provided on the right side in FIG. 5 serves as an individual lead solely used for the chip 1 and that the un-illustrated lead $7q2$ provided on the left side in FIG. 5 so as to oppose the lead $7q1$ serves as an individual lead solely used for the chip 4.

In FIG. 5, the electrode bump $6q1$ is not formed on the electrode pad $5q1$ of the chip 4 located in the corresponding position where the electrode bump $3q1$ of the chip 1 is located.

FIG. 4B is a cross-sectional view for describing connection among pairs of electrode pads comprising a plurality of electrode pads provided in arrow substantially along the center line of the respective main surfaces $1a$ and $4a$ according to the second embodiment, and more particularly, connection among the pair of electrode pads for receiving the CE signal, the pair of electrode pads for receiving the /CE signal, the electrode bumps 3 and 6, and the lead 7. The cross-sectional view is taken along the chain line A—A passing through the center of the electrode pad provided in the cross-sectional view of FIG. 1C, as well as along the chain line B—B passing through the center of the electrode bump provided in the plan view of FIG. 5.

In FIG. 4B, when an identical signal common to the pair of chips is input to or output from both sides of respective identical leads $7o$, $7p$, $7r$, or $7s$ shared between the chips 1 and 4, a plurality of electrode pads provided on the corresponding positions on the main surfaces $1a$ and $4a$; that is, ($2o$, $5o$), ($2p$, $5p$), ($2r$, $5r$), and ($2s$, $5s$), are electrically connected together.

Of the pair of electrode pads $2q1$ and $5q1$ for receiving the CE signal and the pair of electrode pads $2q2$ and $5q2$, the two electrode pads $2q2$ and $5q1$ do not exist. Accordingly, the electrode pad $2q1$ of the chip 1 is solely connected to the lead $7q1$ which permits input or output of an individual chip selection signal into or from one of the pair of chips. The electrode pad $5q2$ of the chip 1 is solely connected to the other lead $7q2$. As mentioned above, in a case where an individual signal is input to or output from an individual lead for each of the pair of chips, one of a pair of electrode pads is electrically connected to one individual lead for one chip, and one of another pair of electrode pads is electrically connected to another individual lead for another chip.

Figure 1D:
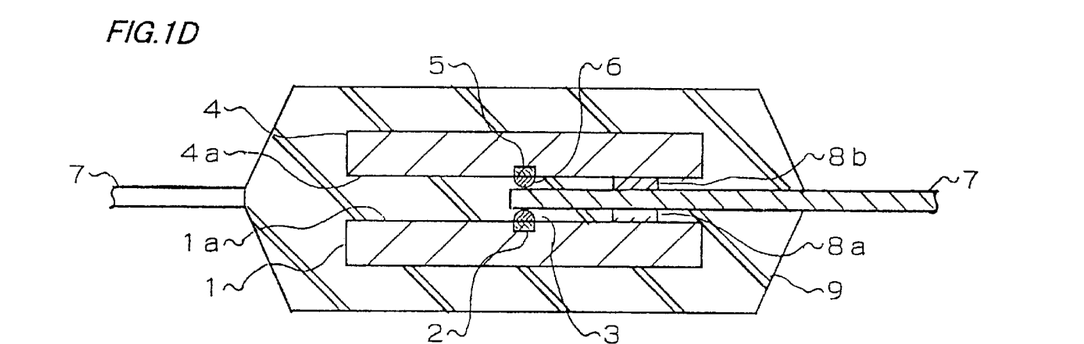

In this embodiment, as shown in the step shown in FIG. 1D, the electrode pads 2 and 5 of the pair of chips 1 and 4 are electrically connected to the lead 7 by way of the electrode bumps 3 and 6, and the chips are sealed and molded into a plastic-packaged semiconductor device.

Now, some modifications of the second embodiment will be described.

(F) As shown in FIG. 4B, an individual signal is input to or output from an individual lead of each of a pair of chips. The pair of electrode pads for receiving the CE selection signal and the pair of pads for receiving the /CE selection signal can be provided in arbitrary positions so as to become spaced apart from each other.

(G) If the electrode bumps $5q1$ and $2q2$ are formed on the electrode pads shown in FIG. 4B, both chips can be selected in parallel at all times.

As mentioned above, the semiconductor device according to the second embodiment comprises (a) a pair of identical chips, each chip including a plurality of electrode pads provided in a row in the center of the main surface of the chip, wherein the electrode pads provided in corresponding positions form an electrode pad pair; (b) the plurality of electrode pads which permit input or output of a common signal and which are connected to both sides of a common lead by way of a pair of electrode bumps; and (c2) a pair of electrode pads which permit input or output individual signals, wherein one of the electrode pad is connected to one individual lead by way of one electrode bump and the other electrode pad is connected to another individual lead by way of another electrode bump.

Third Embodiment

Figure 6:
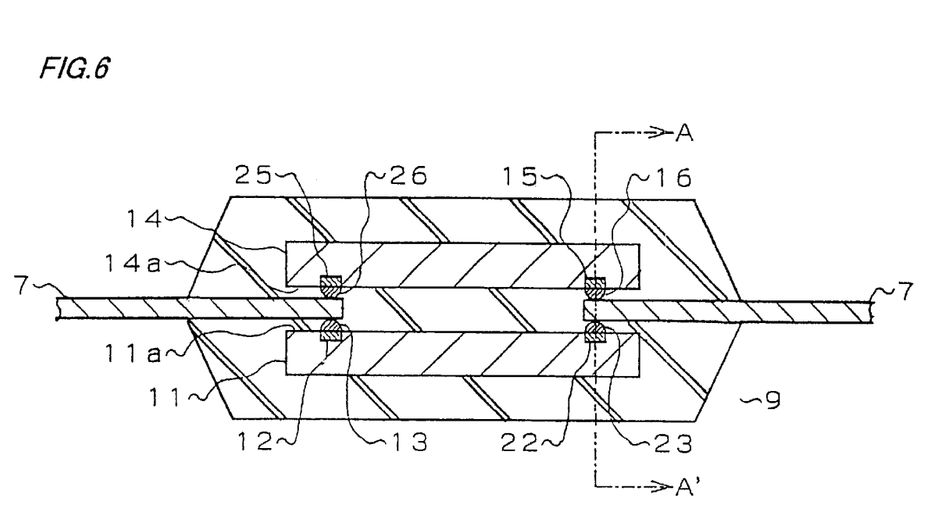
FIG. 6 is a cross-sectional view showing a semiconductor device according to a third embodiment of the present invention.
Figure 7A:
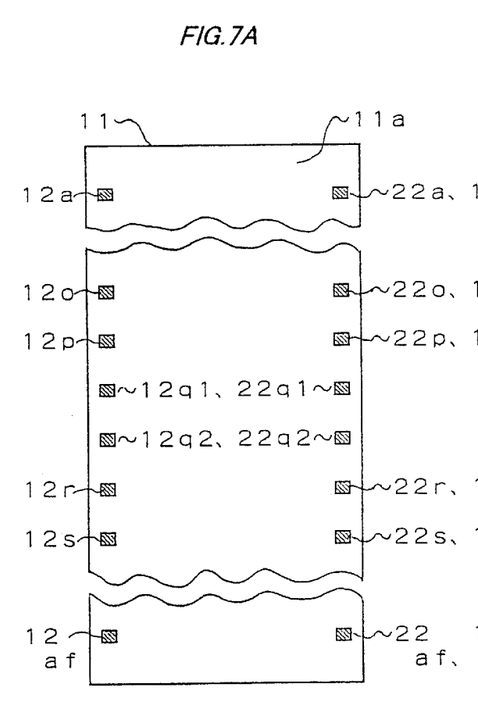
FIGS. 7A and 7B are plan views for describing the layout of electrode pads according to the third embodiment.
Figure 7B:
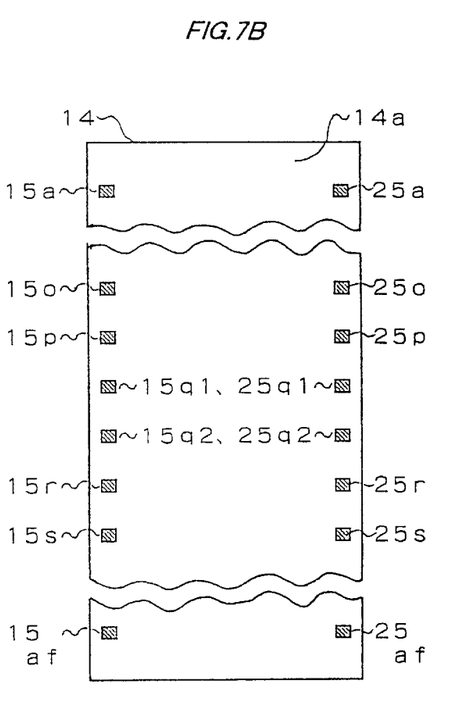

FIG. 6 is a cross-sectional view showing a semiconductor device, and FIGS. 7A and 7B show the layout of electrode pads. There will be omitted description of the reference numerals assigned to the elements which are identical with or correspond to those according to the first embodiment shown in FIGS. 1, 2, and 4.

The previous embodiments have described the plastic-packaged semiconductor device comprising a pair of unit chips, each chip having electrode pads arranged in a row in the center of the main surface of the chip. The third embodiment shown in FIG. 6 is different from the first embodiment shown in FIG. 1D in that a pair of composite chips 11 and 14, each chip having electrode pads provided in a row along both longitudinal edges of the main surface of the chip, are sealed into a packaged with resin while being arranged so as to face each other and are connected at their longitudinal edges to the lead 7.

FIG. 7A shows the layout of electrode pads of the composite chip 11, and FIG. 7B shows the layout of electrode pads of the composite chip 14. The composite chip 11 is formed by integrating the two chips shown in FIGS. 2A and 2B into a single package such that one of the chips is provided in a row along one edge of the main surface 11a and the other chip is provided in a row along the other edge of the same. The composite chip 14 is completely identical with the composite chip 11 in terms of a layout condition of electrode pads. So long as a layout condition of electrode pads is satisfied, the composite chips 11 and 14, for example, may be manufactured into a pair of identical products in an identical lot or manufactured respectively according to different product specifications.

As shown in FIGS. 7A and 7B, the composite chip 11 comprises two electrode pads $12q1$ and $22q1$ for receiving the CE selection signal and two electrode pads $12q2$ and $22q2$ for receiving the /CE selection signal. The composite chip 14 comprises two electrodes $15q1$ and $25q1$ for receiving the CE selection signal and two electrodes $15q2$ and $25q2$ for receiving the /CE selection signal in completely the same manner as does the composite chip 11.

With reference to FIG. 6, the first electrode pad $12q1$ of the composite chip 11 is connected to the lead 7 by way of an un-illustrated electrode bump $13q1$ and is further connected to the first electrode pad $25q1$ of the composite chip 14 by way of an un-illustrated electrode bump $26q1$ of the composite chip 14. Further, similarly, the second electrode pad $22q1$ of the composite chip 11 is connected to the lead 7 by way of the electrode bump $13q1$ and is further connected to the second electrode pad $15q1$ of the composite chip 14 by way of the electrode bump $16q1$ of the composite chip 14.

The pair of composite chips 11 and 14 have the plurality of electrode pads provided in the corresponding locations on the respective main surfaces 11a and 14a. As seen from the first and second embodiments, it can be understood that the composite chips can be applied to the type of connection shown in either FIG. 4A or 4B.

As has been mentioned above, the semiconductor device according to the third embodiment comprises a pair of composite chips, and a plurality of electrode pads provided in a row along each longitudinal side of the main surface of each chip, wherein the electrode pads provided on one chip match in position those provided on the other chip. The plurality of electrode pads, each pair of which is positioned so as to match, are electrically connected to one another so as to permit input or output of a common identical signal to or from the chips by way of both sides of the common lead. At least one pair of electrode pads—which permit input or output of an individual signal to each chip and which are positioned side by side to each other or positioned so as to match each other—are electrically connected together.

Fourth Embodiment

Figure 8:
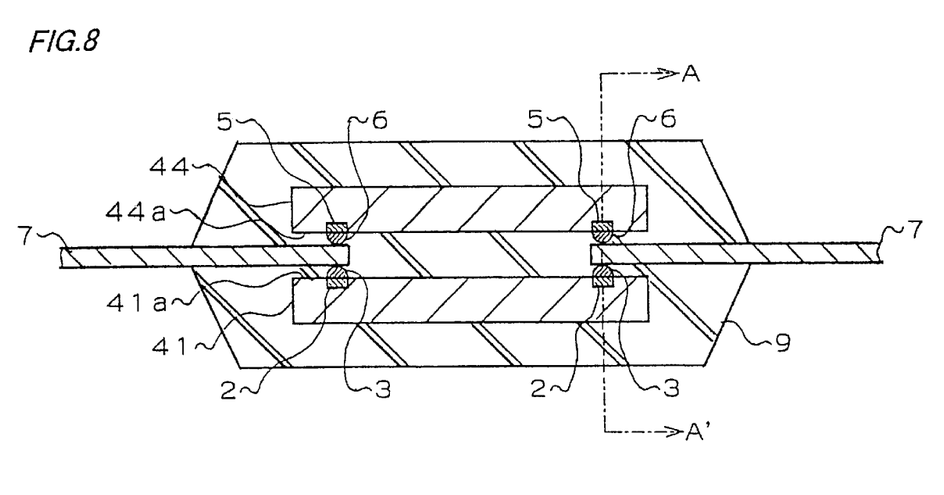
FIG. 8 is a cross-sectional view showing a semiconductor device according to a fourth embodiment of the present invention.
Figure 9A:
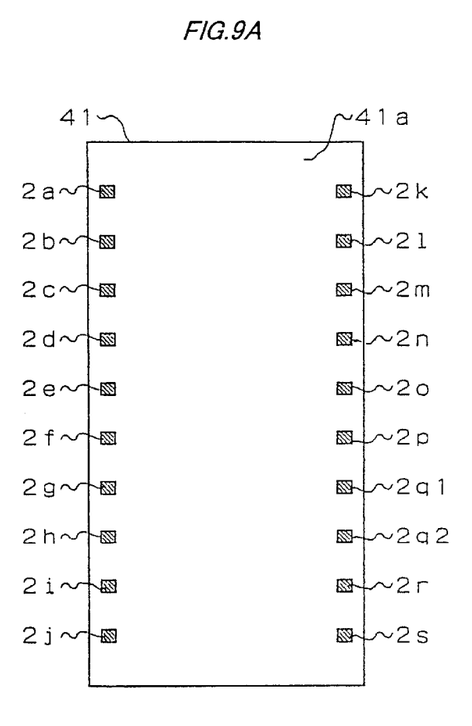
FIGS. 9A and 9B are plan views for describing the layout of electrode pads according to the fourth embodiment.
Figure 9B:
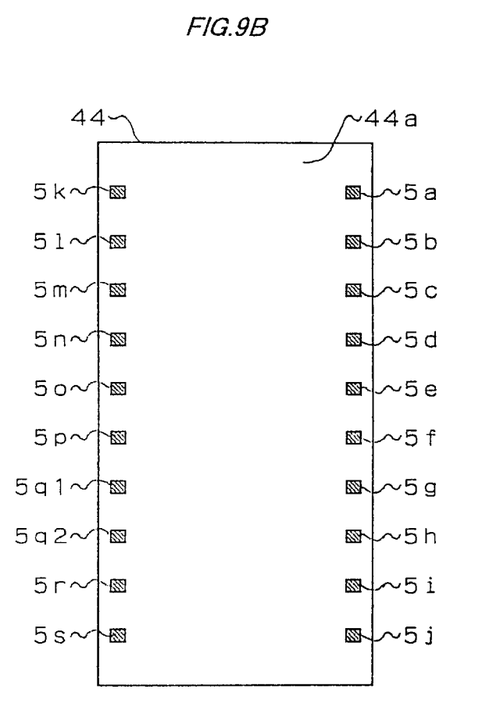
Figure 10:
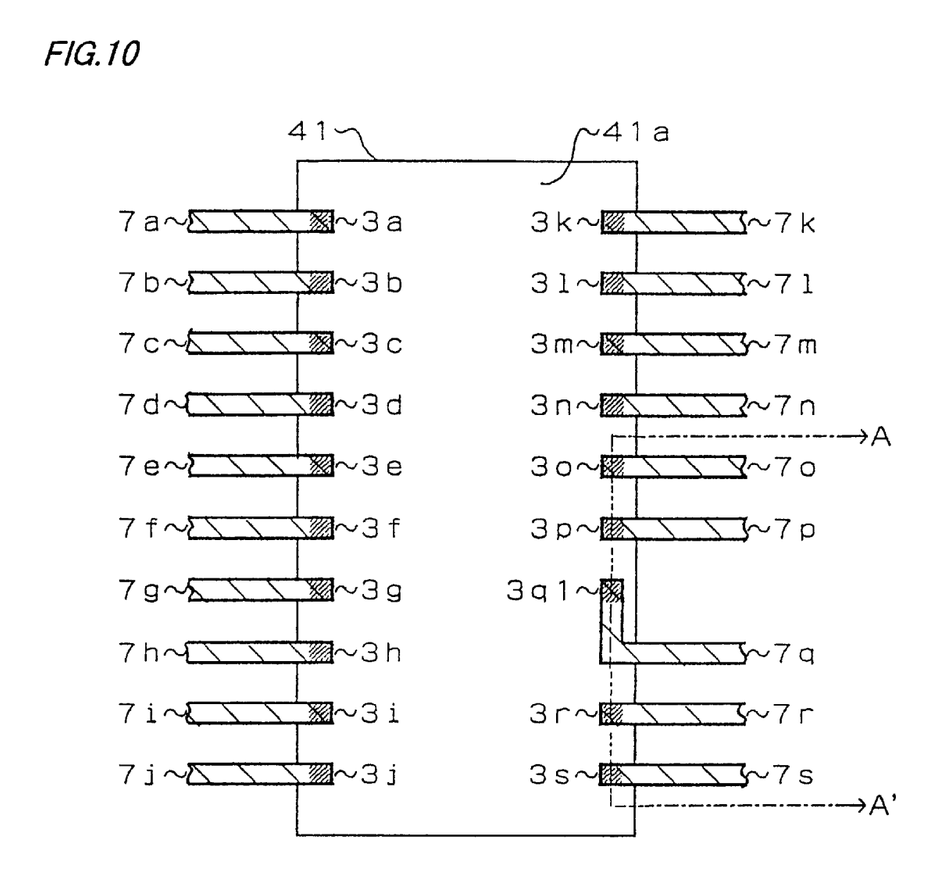
FIG. 10 is a plan view for describing connection between electrode bumps and leads according to the fourth embodiment.

FIG. 8 is a cross-sectional view showing a semiconductor device according to a fourth embodiment of the present invention; FIGS. 9A and 9B show the layout of electrode pads; FIG. 10 is a schematic representation showing connection between electrode bumps and leads; and FIG. 4A is a cross-sectional view for describing connection among electrode pads, electrode bumps, and common leads. There will be omitted description of the reference numerals assigned to the elements which are identical with or correspond to those shown in FIGS. 1 through 7.

The embodiment shown FIG. 8 is different from the first embodiment shown in FIG. 1D in that a pair of chips 41 and 44, each of which has electrode pads arranged on its main surface in a symmetrical pattern, are arranged such that the main surfaces oppose each other and that a row of electrode pads provided along one longitudinal edge of the main surface of one chip and those provided along the other longitudinal edge of the main surface of the other chip are connected together by way of the common lead 7. These chips are sealed with resin into one package.

FIG. 9A shows the layout of electrode pads of the first chip 41. This layout is achieved by rearranging a row of electrode pads provided in the center of the main surface shown in FIG. 2A into two rows along both longitudinal sides of the main surface 41a. The chip 41 comprises the electrode pad $2q1$ for receiving the CE selection signal and the electrode pad $2q2$ for receiving the /CE selection signal.

FIG. 9B shows a layout of electrode pads of the second chip 44. The electrode pads provided into a row of electrode pads in the center of FIG. 2B are provided into rows of electrode pads provided along the edge on each side of the main surface $44a$. The chip 44 has the electrode pads $5q2$ and $2q2$. Since the chips 41 and 44 are formed into a completely symmetric manner under the condition for layout of electrode pads, they are formed into, e.g., separate products which are identical with each other as a unit chip but which have different specifications.

As shown in FIGS. 9A, 10, and 9B, the electrode bump 3$q$1 formed on the electrode pad 2$q$1 of the first chip 41 is connected to the end of the L-shaped edge of the lead 7$q$. The un-illustrated electrode bump 6$q$2 formed on the electrode pad 5$q$2 of the second chip 44 is connected to the corner of the L-shaped edge of the lead 7$q$.

The electrode pad 2$q$1 of the first chip 41 is connected to one side of the lead 7$q$1, which is common to the pair of chips 41 and 44, and which permits input or output of the chip selection signals CE and /CE signals. Further, the electrode pad 5$q$2 of the second chip 44 is connected to the other side of the common lead 7$q$. In such a case, the electrode pad 2$q$2 of the first chip 41 and the electrode pad 5$q$1 of the second chip 44 are not connected to the lead 7$q$.

The embodiment is the same as the previous embodiment with regard to The electrical connection among the electrode pads, the electrode bumps, and the common leads other than the electrical connection between the CE and /CE electrode pads.

In this embodiment, the electrical connection among the electrode pads, the electrode bumps, and the common leads other than the electrical connection between the CE and /CE electrode pads are same with the previous embodiment.

As has been described above, the semiconductor device according to the fourth embodiment comprises a plurality of electrode pads provided along the edge of the main surfaces of chips in a symmetric manner. The electrode pads provided on both chips are connected to common leads which match the electrode pads in position. Further, a pair of electrode pads—which are provided side by side to each other and which permit input or output of individual signals to or from the respective chips—are connected to the common leads which match the pair of electrode pads in position.

The present invention has the foregoing configuration, and the effects and advantageous results are obtained as follows.

According to one aspect of the present invention, a plastic-packaged semiconductor device capable of selecting one of a plurality of chips is formed through use of two chips which have electrodes arranged in identical positions, thus providing a high degree of mass-productivity. Further, the electrode pads which permit input or output of individual signals to the chips are connected to both sides of the adjacent common leads, thus yielding the advantage of being able to reduce the number of leads by half.

In another aspect, the electrode pads which permit input or output of an individual signal are provided in arbitrary positions and are connected to individual leads, thus enabling selection of one of the chips.

In another aspect, electrode pads are provided in a row substantially along the center line of the main surface of the chip, thus equalizing a lag in signal relative to both chips.

In another aspect, electrode pads are arranged in two rows on the main surface of the chip in a longitudinal direction, thus enabling integration of four chips into one package through use of one lead frame.

In another aspect, a pair of chips are integrated into a composite chip comprising therein a plurality of unit chips, enabling manufacture of a semiconductor device having a high degree of integration.

In another aspect, chips and leads are fixedly bonded to each other along the periphery of the main surfaces of the chips, ensuring a high degree of reliability in resin sealing.

In another aspect, electrode pads are provided on the main surface of the chip in a symmetrical manner. The electrode pads which permit input or output of individual signals into or out from the chips are connected to both sides of the adjacent common leads, thus enabling selection of one of the chips having the electrode pads provided thereon in identical positions, through use of a fewer number of leads.

In another aspect, one of the chips can be selected, or both chips can be selected at one time, in response to the logic level of the received input selection signal.

In another aspect, there can be integrated a semiconductor device capable of switching its operation mode in response to the logic level of an input signal.

In another aspect, so long as high-temperature solder is used for forming electrode bumps on the first chip and low-temperature solder is used for forming electrode bumps on the second chip, there is obtained a high degree of bonding reliability between the electrode pads and leads.

Obviously many modifications and variations of the present invention are possible in the light of the above teachings. It is therefore to be understood that within the scope of the appended claims the invention may by practiced otherwise than as specifically described.

What is claimed is:

1. A plastic-packaged semiconductor device comprising at least a pair of chips, said pair of chips being positioned so as to face each other and being connected to common leads between said pair of chips, wherein:

said pair of chips include a plurality of first electrode pads which are provided respectively in mutually corresponding positions on the main surface of said respective chips such that said plurality of first electrode pads provided in the corresponding positions form a plurality of pairs of first electrode pads between said pair of chips;

said plurality of pairs of first electrode pads are electrically connected respectively to opposite sides of one of the common leads by way of electrode bumps formed on each of said respective first electrode pads, and permit input or output of a common signal in or from said chips;

a pair of second electrode pads are provided laterally displaced with respect to each other between said pair of chips;

one pad of the pair of second electrode pads is located on one chip, the other pad of the pair of second electrode pads is located on the other chip, one of the pair of the second electrode pads being electrically connected to one side of a selected common lead by way of an electrode bump formed on one pad of the pair of the second electrode pads, the other pad of the pair of second electrode pads being electrically connected to other side of said selected common lead by way of an electrode bump formed on the other pad of the pair of the second electrode pads, and permit input or output of individual signals to said respective chips; and wherein said chips are configured such that individual signals fed to each of said pair of chips include a voltage signal, and set an operation mode of said chips to switch between one operation mode and another operation mode depending on the logic level.

2. The semiconductor device according to claim 1, wherein the pairs of first and second electrode pads are arranged in a row substantially along the center line of the main surface of said respective chips.

3. The semiconductor device according to claim 1, wherein each of said pair of chips works as a composite chip which incorporates therein a plurality of unit chips.

4. The semiconductor device according to claim 1, wherein the first and second electrode pads are formed into a row substantially along the center line of the main surface of said chips and are electrically connected to the leads, and said lead are fixedly bonded to the main surfaces of said chips by means of a resin-made adhesive.

5. The semiconductor device according to claim 1, wherein said individual signals fed to each chip of said pair of chips are chip selection signals, having one logic level to select one of said chips, and having another logic level to select the other of said chips.

6. The semiconductor device according to claim 1, wherein said electrode bumps provided on one of said pair of chips are formed from high-temperature solder, and said electrode bumps provided on the other of said chips are formed from low-temperature solder.

\* \* \* \* \*